(12) United States Patent
Wang

(10) Patent No.: US 11,984,154 B2
(45) Date of Patent: May 14, 2024

(54) LOCAL AMPLIFIER CIRCUIT, DATA READOUT METHOD, AND MEMORY

(71) Applicant: CHANGXIN MEMORY TECHNOLOGIES, INC., Hefei (CN)

(72) Inventor: Ying Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 191 days.

(21) Appl. No.: 17/854,161

(22) Filed: Jun. 30, 2022

(65) Prior Publication Data

US 2023/0230634 A1 Jul. 20, 2023

Related U.S. Application Data

(63) Continuation of application No. PCT/CN2022/078105, filed on Feb. 25, 2022.

(30) Foreign Application Priority Data

Jan. 14, 2022 (CN) .......................... 202210044983.3

(51) Int. Cl.
*G11C 7/02* (2006.01)
*G11C 11/4094* (2006.01)
*G11C 11/4096* (2006.01)

(52) U.S. Cl.
CPC ...... *G11C 11/4096* (2013.01); *G11C 11/4094* (2013.01)

(58) Field of Classification Search
CPC .................................................. G11C 7/062
USPC ........................................................ 365/207
See application file for complete search history.

(56) References Cited

U.S. PATENT DOCUMENTS

| | | | |
|---|---|---|---|
| 2004/0155281 A1* | 8/2004 | Osada | H01L 27/0928 257/E29.151 |
| 2011/0032780 A1 | 2/2011 | Teramoto | |
| 2011/0103123 A1 | 5/2011 | Nakaoka | |
| 2011/0116334 A1 | 5/2011 | Yu | |
| 2012/0250440 A1* | 10/2012 | Wu | G11C 11/413 365/207 |
| 2019/0304516 A1 | 10/2019 | Shimizu | |

OTHER PUBLICATIONS

Non Final Office Action of the U.S. Appl. No. 17/854,153, issued on Feb. 23, 2024. 26 pages.

* cited by examiner

*Primary Examiner* — Hoai V Ho
(74) *Attorney, Agent, or Firm* — Cooper Legal Group, LLC

(57) ABSTRACT

A local amplifier circuit includes write control transistors, configured to connect, based on write enable signal, global data line to local data line; column selection transistors, configured to connect, based on column selection signal, bit line to local data line; first control PMOS transistor having gate connected to local data line, one of source or drain connected to global data line, and the other one connected to read control transistor; and second control PMOS transistor having gate connected to complementary local data line, one of source or drain connected to complementary global data line, and the other one connected to read control transistor. Read control transistors are configured to pull up or down levels at terminals of first control PMOS transistor and second control PMOS transistor, each of which is source or drain connected to a respective one of read control transistors, to preset level based on read enable signal.

15 Claims, 6 Drawing Sheets

LOCAL AMPLIFIER CIRCUIT, DATA READOUT METHOD, AND MEMORY

CROSS-REFERENCE TO RELATED APPLICATIONS

This application is a continuation of International Application No. PCT/CN2022/078105, filed on Feb. 25, 2022, which claims priority to Chinese Patent Application No. 202210044983.3, filed on Jan. 14, 2022. The disclosures of International Application No. PCT/CN2022/078105 and Chinese Patent Application No. 202210044983.3 are hereby incorporated by reference in their entireties.

BACKGROUND

In the process of data readout in a memory, data is sequentially transmitted from a bit line or complementary bit line to a local data line or complementary local data line and then to a global data line or complementary global data line. The transmission of the data from the local data line or complementary local data line to the global data line or complementary global data line is implemented based on a local amplifier circuit.

When a read operation is performed, the local amplifier circuit waits for data to be transmitted from the bit line or complementary bit line to the local data line or complementary local data line, and then provides the read enable signal for reading out the data to the global data line or complementary global data line. If the read enable signal is provided when the data is not fully transferred to the local data line or complementary local data line, the local data line and complementary local data line are both at high level. Thus, the local data line and complementary local data line are simultaneously discharged, a readout error of the local amplifier circuit is caused or unnecessary power consumption is caused, and a time interval between a time when a column selection signal is provided and a time when the read enable signal is provided affects the performance of the memory.

Therefore, there is an urgent need to design a readout circuit for shortening the time interval between the time when the column selection signal is provided and the time when the read enable signal is provided, so as to optimize the performance of the memory.

SUMMARY

The present disclosure relates to the field of semiconductor circuit design, and in particular, to a local amplifier circuit, a data readout method, and a memory.

Embodiments of the present disclosure provide a local amplifier circuit including write control transistors configured to connect, based on a write enable signal, a global data line to a local data line and a complementary global data line to a complementary local data line; column selection transistors, configured to connect, based on a column selection signal, a bit line to the local data line and a complementary bit line to the complementary local data line; a first control positive-channel-metal-oxide-semiconductor (PMOS) transistor having a gate connected to the local data line, one of a source or a drain connected to the global data line, and the other of the source or the drain connected to a read control transistor; a second control PMOS transistor having a gate connected to the complementary local data line, one of a source or a drain connected to the complementary global data line, and the other of the source or the drain connected to a read control transistor; and a precharge circuit, connected between the local data line and the complementary local data line and configured to precharge the local data line and the complementary local data line to a high level, where the read control transistors are configured to pull up or down levels at terminals of the first control PMOS transistor and the second control PMOS transistor, each of which is the source or the drain connected to a respective one of the read control transistors, to a preset level based on a read enable signal; and the preset level is inverse to a precharge level of the global data line and the complementary global data line.

Embodiments of the present disclosure also provide a memory configured to perform data writing and readout by using a local amplifier circuit. The local amplifier circuit includes: write control transistors configured to connect, based on a write enable signal, a global data line to a local data line and a complementary global data line to a complementary local data line; column selection transistors, configured to connect, based on a column selection signal, a bit line to the local data line and a complementary bit line to the complementary local data line; a first control positive-channel-metal-oxide-semiconductor (PMOS) transistor having a gate connected to the local data line, one of a source or a drain connected to the global data line, and the other of the source or the drain connected to a read control transistor; a second control PMOS transistor having a gate connected to the complementary local data line, one of a source or a drain connected to the complementary global data line, and the other of the source or the drain connected to a read control transistor; and a precharge circuit, connected between the local data line and the complementary local data line and configured to precharge the local data line and the complementary local data line to a high level, where the read control transistors are configured to pull up or down levels at terminals of the first control PMOS transistor and the second control PMOS transistor, each of which is the source or the drain connected to a respective one of the read control transistors, to a preset level based on a read enable signal; and the preset level is inverse to a precharge level of the global data line and the complementary global data line.

BRIEF DESCRIPTION OF THE DRAWINGS

One or more embodiments are exemplarily illustrated by the corresponding drawings. These exemplary descriptions do not limit the embodiments, unless otherwise stated, the pictures in the drawings do not limit the scale. In order to more clearly illustrate the embodiments of the present disclosure or the technical solutions in the conventional technology, the accompanying drawings required in the embodiments will be briefly described below. It is apparently that the accompanying drawings in the following description are merely some embodiments of the present disclosure, and other drawings may be drawn from these drawings by those skilled in the art without creative efforts.

DETAILED DESCRIPTION

In the process of data readout in a memory, data is sequentially transmitted from a bit line or complementary bit line to a local data line or complementary local data line and then to a global data line or complementary global data line. The transmission of the data from the local data line or complementary local data line to the global data line or complementary global data line is implemented based on a local amplifier circuit.

When a read operation is performed, the local amplifier circuit waits for data to be transmitted from the bit line or complementary bit line to the local data line or complementary local data line, and then provides the read enable signal for reading out the data to the global data line or complementary global data line. If the read enable signal is provided when the data is not fully transferred to the local data line or complementary local data line, the local data line and complementary local data line are both at high level. Thus, the local data line and complementary local data line are simultaneously discharged, a readout error of the local amplifier circuit is caused or unnecessary power consumption is caused, and a time interval between a time when a column selection signal is provided and a time when the read enable signal is provided affects the performance of the memory.

Embodiments of the present disclosure provide a local amplifier circuit that shortens the time interval between the time when the column selection signal is provided and the time when the read enable signal is provided during the data readout stage, and accelerates data readout from the memory.

It will be appreciated by those of ordinary skill in the art that, in various embodiments of the present disclosure, many technical details are presented to enable the reader to better understand the present disclosure. However, the technical solution claimed in the present disclosure can be realized without these technical details and various changes and modifications based on the following embodiments. The divisions of the following embodiments are for convenience of description and should not constitute any limitation to the specific implementation of the present disclosure, and each of the embodiments may be combined with each other and referenced without contradiction.

Figure 1:
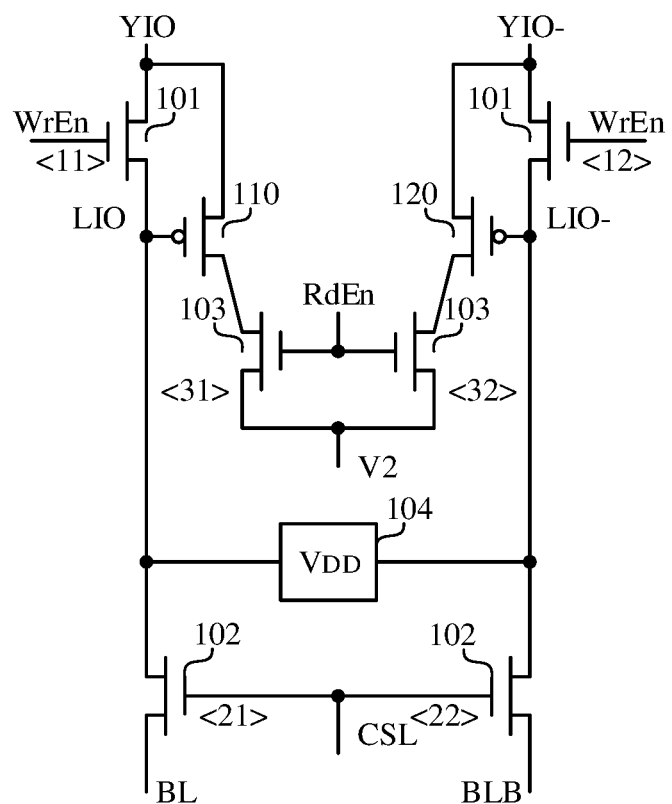
FIG. 1 is a structural diagram of a local amplifier circuit according to an embodiment of the present disclosure.
Figure 2:
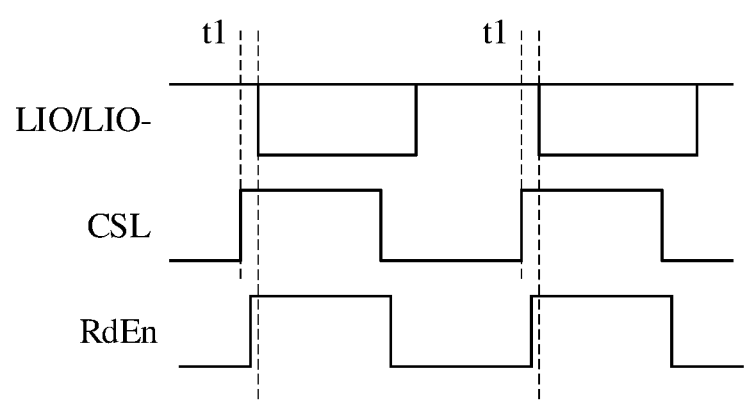
FIG. 2 is a timing diagram of a read enable signal and a column selection signal according to an embodiment of the present disclosure.
Figure 3:
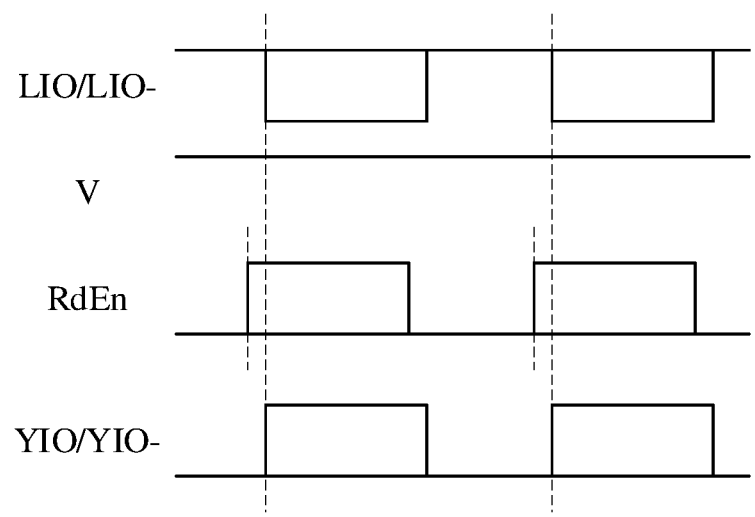
FIG. 3 and FIG. 4 are timing diagrams of signals when the data on the local data line or complementary local data line is read to the global data line or complementary global data line according to an embodiment of the present disclosure.
Figure 4:
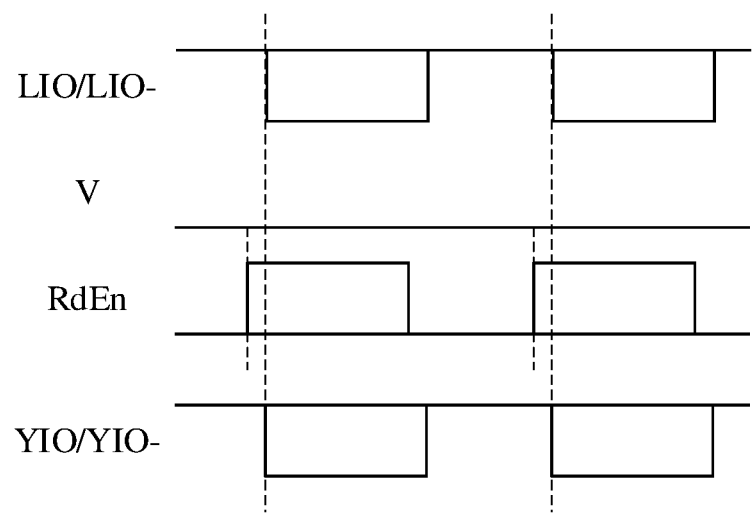
Figure 5:
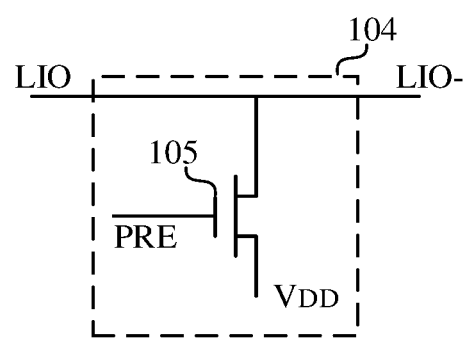
FIG. 5 is a schematic structural diagram of a precharge circuit according to an embodiment of the present disclosure.

FIG. 1 is a schematic structural diagram of a local amplifier circuit according to the embodiment, FIG. 2 is a timing diagram of a read enable signal and a column selection signal according to the embodiment, FIG. 3 and FIG. 4 are timing diagrams of a signal when the data on the local data line or complementary local data line is read out to the global data line or complementary global data line according to the embodiment, and FIG. 5 is a schematic structural diagram of a precharge circuit according to the embodiment. The local amplifier circuit according to the embodiments is further described in detail with reference to the accompanying drawings.

Referring to FIG. 1, a local amplifier circuit includes: write control transistors 101, column selection transistors 102, a first control PMOS transistor 110, a second control PMOS transistor 120 and a precharge circuit 104.

The write control transistor 101 is configured to connect, based on a write enable signal WrEn, a global data line YIO to a local data line LIO and a complementary global data line YIO− to a complementary local data line LIO−.

The write enable signal WrEn is used for turning on the write control transistor 101. The global data line YIO and the complementary global data line YIO− are used for transmitting data inverse to each other, that is to say, the global data line YIO is used for transmitting high-level data, and the complementary global data line YIO− is used for transmitting low-level data; or the global data line YIO is used for transmitting low-level data, and the complementary global data line YIO− is used for transmitting high-level data. In addition, the local data line LIO and the complementary local data line LIO− are also used for transmitting data inverse to each other.

The column selection transistor 102 is configured connect, based on a column selection signal CSL, a bit line BL to the local data line LIO and a complementary bit line BLB to the complementary local data line.

The column selection signal CSL is used for turning on the column selection transistor 102. The bit line BL and the complementary bit line BLB is used for transmitting data inverse to each other, and memory cells are connected to the bit line BL and the complementary bit line BLB. The process that data is transmitted from the local data line LIO to the bit line BL or the data is transmitted from the complementary local data line LIO− to the complementary bit line BLB is a data storage stage of the memory; and the process that the data is transmitted from the bit line BL to the local data line LIO or the data is transmitted from the complementary bit line BLB to the complementary local data line LIO− is the data readout stage of the memory.

The first control PMOS transistor 110 has a gate connected to the local data line LIO, one of a source or a drain connected to the global data line YIO, and the other of the source or the drain connected to a read control transistor 103.

The second control PMOS transistor 120 has a gate connected to the complementary local data line LIO−, one of a source or a drain connected to the complementary global data line YIO−, and the other of the source or the drain connected to a read control transistor 103.

The first control transistor 110 is controlled by the level of the local data line LIO. When the local data line LIO is at the low level, the first control transistor 110 is turned on, and one of the source or drain of the read control transistor 103 is connected to the global data line YIO. When the local data line LIO is at the high level, the first control PMOS transistor 110 is turned off. The second control PMOS transistor 120 is controlled by the level of the complementary local data line LIO−. When the complementary local data line LIO− is at the low level, the second control PMOS transistor 120 is turned on, and one of the source or drain of the read control transistor 103 is connected to the complementary global data line YIO−. When the complementary local data line LIO− is at the high level, the second control PMOS transistor 120 is turned off.

The precharge circuit 104 is connected between the local data line LIO and the complementary local data line LIO−, and configured to precharge the local data line LIO and the complementary local data line LIO− to a high level, i.e., the first control PMOS transistor 110 and the second control PMOS transistor 120 are turned off before the levels of the local data line LIO and the complementary local data line LIO− change.

The read control transistors 103 are configured to pull up or down levels at terminals of the first control PMOS transistor and the second control PMOS transistor, each of which is the source or the drain connected to a respective one of the read control transistors, to a preset level based on a read enable signal RdEn; and the preset level is inverse to a precharge level of the global data line YIO and the complementary global data line YIO−.

The read enable signal RdEn is used for turning on the read control transistor 103. When the read control transistor 103 and the first control transistor 110 are turned on, the read control transistor 103 pulls up or down the level of the global data line YIO to a preset level, and when the read control transistor 103 and the second control transistor 120 are turned on, the read control transistor 103 pulls up or down the level of the complementary global data line YIO− to a preset level. The preset level is inverse to the precharge level of the global data line YIO and the complementary global data line YIO−.

Based on the local amplifier circuit provided in the embodiment, the local data line LIO and the complementary local data line LIO− are precharged to the high level by the precharge circuit 104, the first control PMOS transistor 110 and the second control PMOS transistor 120 cannot be turned on at the high level. During data writing stage, the write enable signal WrEn is provided, the data on the global data line YIO and the complementary global data line YIO− are transmitted to the local data line LIO and the complementary local data line LIO−, and the turning on of the first control PMOS transistor 110 and the second control PMOS transistor 120 does not affect the data writing of the memory because the read control transistor 103 cannot be turned on. During the data readout stage, the read enable signal RdEn may be provided in advance, in this case, the data readout of the memory is not affected because the first control PMOS transistor 110 and the second control PMOS transistor 120 cannot be turned on. After the column selection signal CSL is provided, the data of the bit line BL and the complementary bit line BLB are synchronized to the local data line LIO and the complementary local data line LIO−. The first control PMOS transistor 110 or the second control PMOS transistor 120 is turned on, so that the corresponding readout path is turned on, and the data on the local data line LIO and the complementary local data line LIO− are transmitted to the global data line YIO and the complementary global data line YIO−. Thus, during the data readout stage, the time interval between the time when the column selection signal CSL is provided and the time when the read enable signal RdEn is provided is shortened, and the data readout of the memory is accelerated.

It is to be noted that, referring to FIG. 2, based on the local amplifier circuit provided in the embodiment, since there is a time delay t1 between the time when the column selection signal CSL is provided and the time that the level change of the local data line LIO and the complementary local data line LIO− is completed, it is only necessary to ensure that the read enable signal RdEn is provided before the time when the level change of the local data line LIO and the complementary local data line LIO− is completed, so that the data readout of the memory can also be accelerated, that is to say, in some embodiments, the read enable signal can be provided within the time period t1.

In some embodiments, referring to FIG. 3, the precharge level of the global data line and the complementary global data line precharged before data readout is a low level, and the preset level is a high level. In this case, the level of the global data line YIO is pulled up to the high level when the read control transistor 103 and the first control PMOS transistor 110 are turned on; the level of the complementary global data line YIO− is pulled up to the high level when the read control transistor 103 and the second control PMOS transistor 120 are turned on.

In some embodiments, referring to FIG. 4, the precharge level of the global data line and the complementary global data line precharged before data readout is a high level, and the preset level is a low level. In this case, the level of the global data line YIO is pulled down to the low level when the read control transistor 103 and the first control transistor 110 are turned on; the level of the complementary global data line YIO− is pulled down to the low level when the read control transistor 103 and the second control transistor 120 are turned on.

In some embodiments, the high level of the precharge circuit 104 for precharging is provided by the internal power supply voltage VDD of the memory of the local amplifier circuit, i.e., the local data line LIO and the complementary local data line LIO− are precharged by the internal power supply voltage VDD of the memory prior to the data readout stage or data writing stage.

Specifically, referring to FIG. 5, the precharge circuit 104 includes a precharge MOS transistor 105 having a gate configured to receive a precharge signal PRE, one of a source or drain connected to the local data line LIO and the complementary local data line LIO−, and the other of the source or the drain configured to receive the internal power supply voltage VDD, thereby achieving precharge of the local data line LIO and the complementary local data line LIO− controlled by the precharge signal PRE.

In some embodiments, widths of the first control PMOS transistor 110 and the second control PMOS transistor 120 are both set to be twice a standard width of the negative-channel-metal-oxide-semiconductor (NMOS) transistor used by the local amplifier circuit, to enhance the driving capability of the PMOS transistor, so that faster response can be made based on the local data line LIO and the complementary local data line LIO−.

In some embodiments, continuing to refer to FIG. 1, the write control transistors 101 include: a first write MOS transistor <11> and a second write MOS transistor <12>.

The first write MOS transistor <11> has a gate configured to receive the write enable signal WrEn, a source connected to the global data line YIO, and a drain connected to the local data line LIO.

The second write MOS transistor <12> has a gate configured to receive the write enable signal WrEn, a source connected to the complementary global data line YIO−, and a drain connected to the complementary local data line LIO−.

The NMOS transistor has a stronger pull-down capability than the PMOS transistor, and in the embodiment, the first write MOS transistor <11> and the second write MOS transistor <12> are NMOS transistors, thus it is possible to accelerate the pull-down of the local data line LIO or the complementary local data line LIO− to the low level after the read enable signal WrEn is provided. In some embodiments, the first write MOS transistor <11> and the second write MOS transistor <12> are PMOS transistors, thereby sharing an active region with the first control PMOS transistor 110 and the second control PMOS transistor 120, so that the layout area of the local amplifier circuit is saved.

In some embodiments, continuing to refer to FIG. 1, column selection transistors 102 include: a first column selection transistor <21> and a second column selection transistor <22>.

The first column selection transistor <21> has a gate configured to receive the column selection signal CSL, a source connected to the local data line LIO, and a drain connected to the bit line BL.

The second column selection transistor <22> has a gate configured to receive the column selection signal CSL, a source connected to the complementary local data line LIO−, and a drain connected to the complementary bit line BLB.

The NMOS transistor has a stronger pull-down capability than the PMOS transistor, and in the embodiment, the first column selection transistor <21> and the second column selection transistor <22> are NMOS transistors, thus it is possible to accelerate the pull-down of the local data line LIO or the complementary local data line LIO− to the low level after the column selection signal CSL is provided. In some embodiments, the first column select transistor <21> and the second column select transistor <22> are PMOS transistors, thereby sharing the active region with the first control PMOS transistor 110 and the second control PMOS transistor 120, so that the layout area of the local amplifier circuit is saved.

In some embodiments, continuing to refer to FIG. 1, the read control transistors 103 include: a first read MOS transistor <31> and a second read MOS transistor <32>.

The first read MOS transistor <31> has a gate configured to receive the read enable signal RdEn, a source connected to the first control NMOS transistor 110, and a drain configured to receive a first preset level V1.

The second read MOS transistor <32> has a gate configured to receive the read enable signal RdEn, a source connected to the second control NMOS transistor 120, and a drain configured to receive the a first preset level V1.

In the embodiment, the first read MOS transistor <31> and the second read MOS transistor <32> are PMOS transistors, thereby sharing the active region with the first control PMOS transistor 110 and the second control PMOS transistor 120, and saving the layout area of the local amplifier circuit.

It is to be noted that, for the above-mentioned various types of MOS transistor, the connection of the specific "source" and "drain" does not constitute a limitation to the embodiment. In other embodiments, the connection where the "source" is replaced by the "drain" and the "drain" is replaced by the "source" can be adopted.

It is to be noted that the features disclosed in the local amplifier circuit provided in the above-described embodiments may be arbitrarily combined without conflicts, and a new circuit embodiment may be obtained.

Based on the local amplifier circuit provided in the embodiment, the local data line LIO and the complementary local data line LIO− are precharged to the high level by the precharge circuit 104, the first control PMOS transistor 110 and the second control PMOS transistor 120 cannot be turned on at the high level. During data writing stage, the write enable signal WrEn is provided, the data on the global data line YIO and the complementary global data line YIO− are transmitted to the local data line LIO and the complementary local data line LIO−, and the turning on of the first control PMOS transistor 110 and the second control PMOS transistor 120 does not affect the data writing of the memory because the read control transistor 103 cannot be turned on. During the data readout stage, the read enable signal RdEn may be provided in advance, in this case, the data readout of the memory is not affected because the first control PMOS transistor 110 and the second control PMOS transistor 120 cannot be turned on. After the column selection signal CSL is provided, the data of the bit line BL and the complementary bit line BLB are synchronized to the local data line LIO and the complementary local data line LIO−. The first control PMOS transistor 110 or the second control PMOS transistor 120 is turned on, so that the corresponding readout path is turned on, and the data on the local data line LIO and the complementary local data line LIO− are transmitted to the global data line YIO and the complementary global data line YIO−. Thus, during the data readout stage, the time interval between the time when the column selection signal CSL is provided and the time when the read enable signal RdEn is provided is shortened, and the data readout of the memory is accelerated.

Another embodiment of the present disclosure provides a data readout method. Based on the local amplifier circuit provided in the present embodiment, during the data readout stage, the time interval between the time when the column selection signal is provided and the time when the read enable signal is provided is shorten and the data readout of the memory is accelerated.

Figure 6:
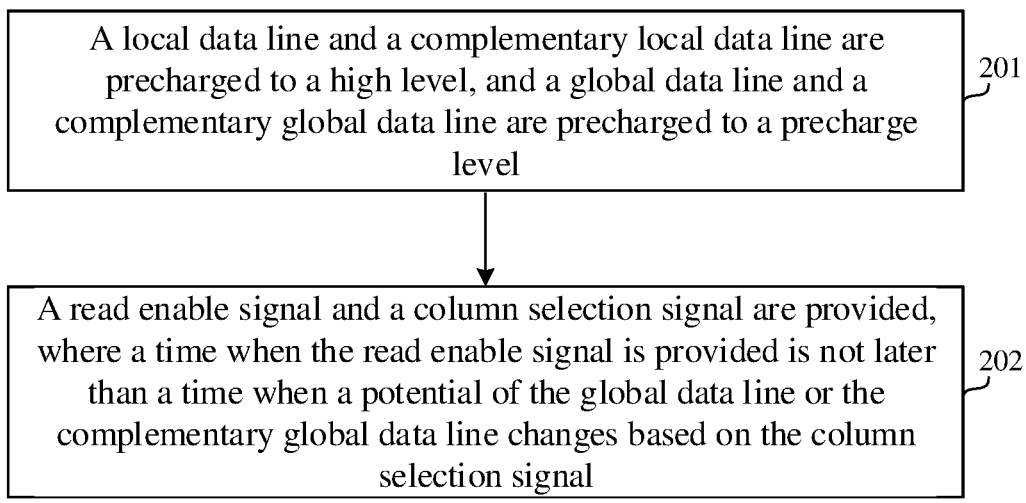
FIG. 6 is a flowchart of a data readout method according to another embodiment of the present disclosure.

FIG. 6 is a flowchart of a data readout method according to the embodiment. The data readout method according to the embodiment is further described in detail with reference to the accompanying drawings, and is specifically as follows.

Referring to FIG. 6, a data readout method includes operations 201 to 202.

In operation 201, a local data line and a complementary local data line are precharged to a high level, and a global data line and a complementary global data line are precharged to a precharge level.

Specifically, prior to a readout stage, the local data line and the complementary local data line is precharged to a high level, and the global data line and the complementary global data line is precharged to a precharge level.

In operation 202, a read enable signal and a column selection signal are provided, where a time when the read enable signal is provided is not later than a time when a level of the global data line or the complementary global data line changes based on the column selection signal.

Specifically, during the readout stage, the read enable signal is provided to pull up or down a level of the global data line to a preset level when the first control PMOS transistor is turned on, and to pull up or down a level of the complementary global data line to a preset level when the second control PMOS transistor is turned on; and a column selection signal is provided to synchronize a level of the bit line to the local data line and synchronize a level of the complementary bit line to the complementary local data line, where a time when the read enable signal is provided is not later than a time when a level of the global data line or the complementary global data line changes based on the column selection signal.

The local data line and the complementary local data line are precharged to the high level by the precharge circuit, the first control PMOS transistor and the second control PMOS transistor cannot be turned on at the high level. During data writing stage, the write enable signal is provided, the data on the global data line and the complementary global data line are transmitted to the local data line and the complementary local data line, and the turning on of the first control PMOS transistor and the second control PMOS transistor does not affect the data writing of the memory because the read control transistor cannot be turned on. During the data readout stage, the read enable signal may be provided in advance, in this case, the data readout of the memory is not affected because the first control PMOS transistor and the second control PMOS transistor cannot be turned on. After the column selection signal is provided, the data of the bit line BL and the complementary bit line are synchronized to the local data line and the complementary local data line.

The first control PMOS transistor or the second control PMOS transistor is turned on, so that the corresponding readout path is turned on, and the data on the local data line and the complementary local data line are transmitted to the global data line and the complementary global data line. Thus, during the data readout stage, the time interval between the time when the column selection signal is provided and the time when the read enable signal is provided is shortened, and the data readout of the memory is accelerated.

With reference to FIG. 2, there is a time delay t1 between the time when the column selection signal CSL is provided and the time that the level change of the local data line LIO and the complementary local data line LIO− is completed, it is only necessary to ensure that the read enable signal RdEn is provided before the time when the level change of the local data line LIO and the complementary local data line LIO− is completed, so that the data readout of the memory can also be accelerated, that is to say, in some embodiments, the read enable signal can be provided within the time period t1. In some embodiments, the time when the read enable signal is provided is not later than a time when the column selection signal is provided. In some embodiments, the read enable signal and the column selection signal are provided simultaneously.

It is to be noted that the description of the above data readout method is similar to that of the above-described local amplifier circuit embodiments, and has advantages similar to those of the above-described local amplifier circuit embodiments, and therefore, details are not described. Technical details not disclosed in the data readout method of the embodiments of the present disclosure are understood with reference to the description of the local amplifier circuit in the embodiments of the present disclosure.

Yet another embodiment of the present disclosure provides a memory configured to perform data writing and readout by using the local amplifier circuit provided in the above embodiment, so as to shorten a time interval between the time when the column selection signal is provided and the time when the read enable signal is provided, and accelerate the data readout of the memory.

In some embodiments, the memory is a Dynamic Random Access Memory (DRAM) chip.

In some embodiments, the memory is a Synchronous Dynamic Random Access Memory (SDRAM) chip.

Those of ordinary skill in the art will appreciate that each embodiment is a specific embodiment implementing the disclosure, and in practical applications, various variations about the form and details can be made thereto without departing from the spirit and scope of the disclosure.

The invention claimed is:

1. A local amplifier circuit, comprising:
write control transistors, configured to connect, based on a write enable signal, a global data line to a local data line and a complementary global data line to a complementary local data line;
column selection transistors, configured to connect, based on a column selection signal, a bit line to the local data line and a complementary bit line to the complementary local data line;
a first control Positive-channel Metal-Oxide-Semiconductor (PMOS) transistor having a gate connected to the local data line, one of a source or a drain connected to the global data line, and the other of the source or the drain connected to a read control transistor;
a second control PMOS transistor having a gate connected to the complementary local data line, one of a source or a drain connected to the complementary global data line, and the other of the source or the drain connected to a read control transistor; and
a precharge circuit connected between the local data line and the complementary local data line and configured to precharge the local data line and the complementary local data line to a high level,
wherein the read control transistors are configured to pull up or down levels at terminals of the first control PMOS transistor and the second control PMOS transistor, each of which is the source or the drain connected to a respective one of the read control transistors, to a preset level based on a read enable signal; and
the preset level is inverse to a precharge level of the global data line and the complementary global data line.

2. The local amplifier circuit of claim 1, wherein the high level is provided from an internal power supply voltage of a memory to which the local amplifier circuit belongs.

3. The local amplifier circuit of claim 2, wherein the precharge circuit comprises a precharge Metal-Oxide-Semiconductor (MOS) transistor having a gate configured to receive a precharge signal, one of a source or a drain connected to the local data line and the complementary local data line, and the other of the source or the drain configured to receive the internal power supply voltage.

4. The local amplifier circuit of claim 1, wherein the precharge level of the global data line and the complementary global data line precharged before data readout is a low level, and the preset level is a high level.

5. The local amplifier circuit of claim 1, wherein the precharge level of the global data line and the complementary global data line precharged before data readout is a high level, and the preset level is a low level.

6. The local amplifier circuit of claim 1, wherein widths of the first control PMOS transistor and the second control PMOS transistor are both set to be twice a standard width of a Negative-channel Metal-Oxide-Semiconductor (NMOS) transistor used by the local amplifier circuit.

7. The local amplifier circuit of claim 1, wherein the write control transistors comprise:
a first write Metal-Oxide-Semiconductor (MOS) transistor, having a gate configured to receive the write enable signal, a source connected to the global data line, and a drain connected to the local data line; and
a second write MOS transistor having a gate configured to receive the write enable signal, a source connected to the complementary global data line, and a drain connected to the complementary local data line.

8. The local amplifier circuit of claim 1, wherein the column selection transistor comprises:
a first column selection Metal-Oxide-Semiconductor (MOS) transistor, having a gate configured to receive the column selection signal, a source connected to the local data line, and a drain connected to the bit line; and
a second column select MOS transistor, having a gate configured to receive the column selection signal, a source connected to the complementary local data line, and a drain connected to the complementary bit line.

9. The local amplifier circuit of claim 1, wherein the read control transistors comprise:
a first read Metal-Oxide-Semiconductor (MOS) transistor, having a gate configured to receive the read enable signal, a source connected to a first control NMOS transistor and a drain configured to receive the high level; and a second read MOS transistor, having a gate configured to receive the read enable signal, a source connected to a second control NMOS transistor and a drain configured to receive the high level.

10. The local amplifier circuit of claim 9, wherein the first read MOS transistor and the second read MOS transistor are PMOS transistors.

11. A data readout method, applied to the local amplifier circuit of claim 1, the method comprises:
prior to a readout stage, precharging the local data line and the complementary local data line to a high level, and precharging the global data line and the complementary global data line to a precharge level;
during the readout stage, providing the read enable signal to pull up or down a level of the global data line to a preset level when the first control PMOS transistor is turned on, and to pull up or down a level of the complementary global data line to a preset level when the second control PMOS transistor is turned on; and
providing a column selection signal to synchronize a level of the bit line to the local data line and synchronize a level of the complementary bit line to the complementary local data line,
wherein a time when the read enable signal is provided is not later than a time when a level of the global data line or the complementary global data line changes based on the column selection signal.

12. The data readout method of claim 11, wherein the time when the read enable signal is provided is not later than a time when the column selection signal is provided.

13. The data readout method of claim 11, wherein the read enable signal and the column selection signal are provided simultaneously.

14. A memory, configured to perform data writing and readout by using a local amplifier circuit, wherein the local amplifier circuit comprises:
write control transistors, configured to connect, based on a write enable signal, a global data line to a local data line and a complementary global data line to a complementary local data line;
column selection transistors, configured to connect, based on a column selection signal, a bit line to the local data line and a complementary bit line to the complementary local data line;
a first control Positive-channel Metal-Oxide-Semiconductor (PMOS) transistor having a gate connected to the local data line, one of a source or a drain connected to the global data line, and the other of the source or the drain connected to a read control transistor;
a second control PMOS transistor having a gate connected to the complementary local data line, one of a source or a drain connected to the complementary global data line, and the other of the source or the drain connected to a read control transistor; and
a precharge circuit, connected between the local data line and the complementary local data line and configured to precharge the local data line and the complementary local data line to a high level,
wherein the read control transistors are configured to pull up or down levels at terminals of the first control PMOS transistor and the second control PMOS transistor, each of which is the source or the drain connected to a respective one of the read control transistors, to a preset level based on a read enable signal; and
the preset level is inverse to a precharge level of the global data line and the complementary global data line.

15. The memory of claim 14, wherein the memory comprises: Dynamic Random Access Memory (DRAM), Synchronous Dynamic Random Access Memory (SDRAM).

* * * * *